United States Patent [19]

Bayne et al.

[11] Patent Number: 4,911,638
[45] Date of Patent: Mar. 27, 1990

[54] CONTROLLED DIFFUSION ENVIRONMENT CAPSULE AND SYSTEM

[75] Inventors: Christopher J. Bayne, Los Gatos; H. Chris Guiver, Ben Lomond, both of Calif.

[73] Assignee: Direction Incorporated, Sunnyvale, Calif.

[21] Appl. No.: 354,133

[22] Filed: May 18, 1989

[51] Int. Cl.⁴ .......................... F27B 9/04; C23C 16/00
[52] U.S. Cl. ..................................... 432/152; 432/253; 432/11; 118/715; 118/725
[58] Field of Search ........................ 432/152, 253, 5, 6, 432/11; 118/715, 725

[56] References Cited

U.S. PATENT DOCUMENTS

| | | | |
|---|---|---|---|
| 4,220,116 | 9/1980 | Hochberg | 118/715 |
| 4,509,456 | 4/1985 | Kleinert et al. | 118/715 |
| 4,526,534 | 7/1985 | Wollmann | 432/11 |
| 4,699,805 | 10/1987 | Seelbach et al. | 118/715 X |
| 4,756,272 | 7/1988 | Kessler et al. | 118/725 X |
| 4,798,165 | 1/1989 | de Boer et al. | 118/71 |

Primary Examiner—Henry A. Bennet
Assistant Examiner—Christopher B. Kilner
Attorney, Agent, or Firm—Flehr, Hohbach, Test, Albritton & Herbert

[57] ABSTRACT

A controlled diffusion environment capsule system (10) is used with a conventional tubular high temperature furnace (12) as employed in semiconductor manufacturing. The system (10) includes a cantilever boat loading apparatus (14) and a quartz diffusion capsule (16). Wafer carriers (20) support semiconductor wafers (22) concentrically with capsule (16) in closely spaced relationship for processing in the furnace (12). The diffusion capsule (16) is supported on a pair of quartz rods (24). A quartz injector tube (28) extends the length of the diffusion capsule (16). The injector tube (28) has three rows of high aspect-ratio apertures (30) extending along its length to disperse nitrogen or other inert gas uniformly across the surfaces (32) of the wafers (22). A quartz extender (34) is connected to the distal end of the diffusion capsule (16), through which reactant gases are supplied to the capsule (16) for diffusion and/or oxidation, from an inlet source (35) of the reactant gases on the furnace tube near the extender (34). The extender (34) has two apertured baffle plates (36) and (38) which have holes (40) and (42) in patterns that are offset relative to one another. A third plate (44) has a larger hole (46) at its center. The hole (46) focuses reactant gases into the capsule and the holes (40) and (42) provide turbulence to the reactant gas stream prior to its entry into the capsule (16) to assure uniform mixing.

8 Claims, 4 Drawing Sheets

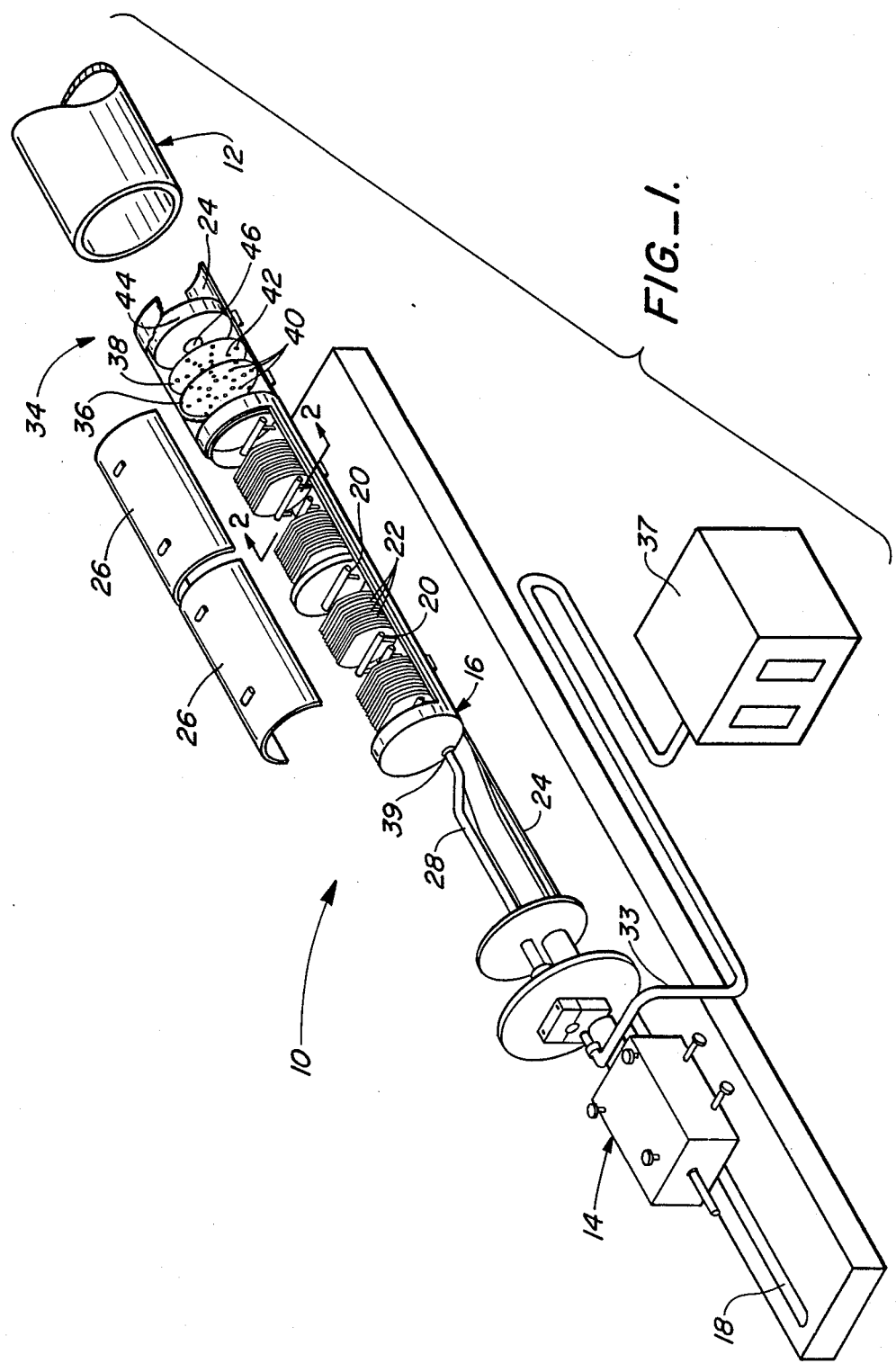

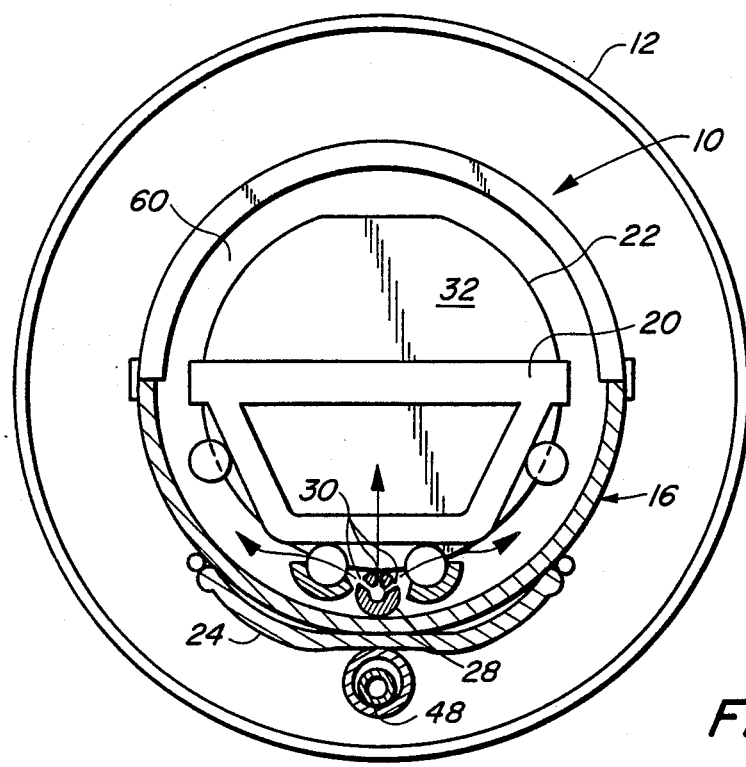
FIG._2.
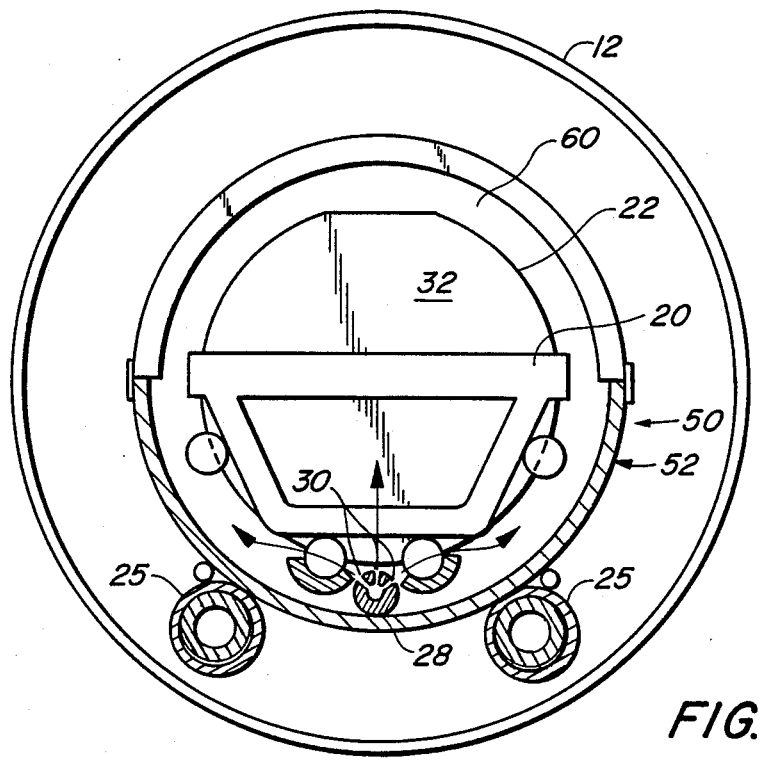
FIG._6.

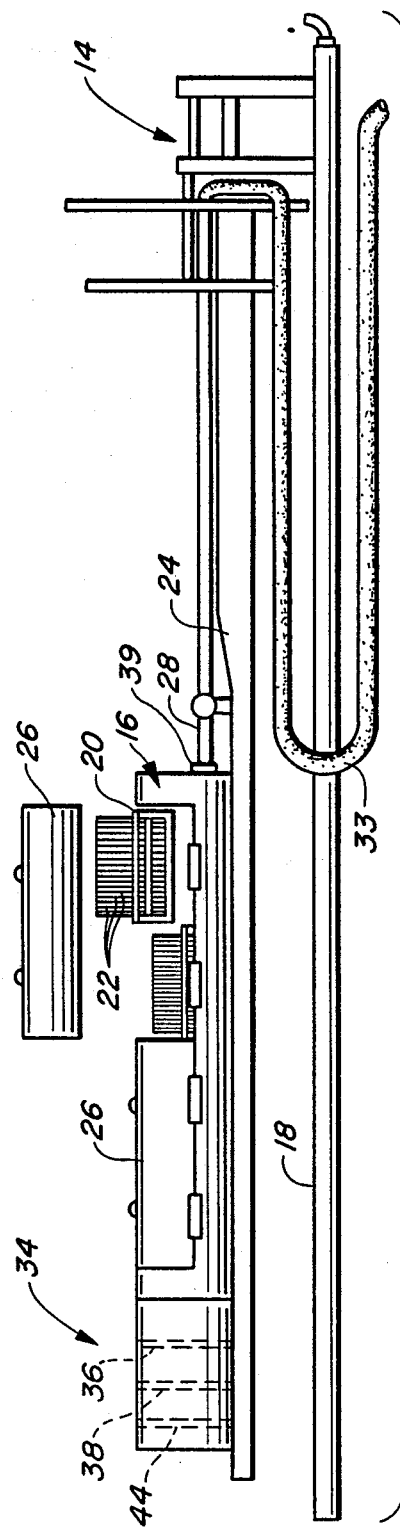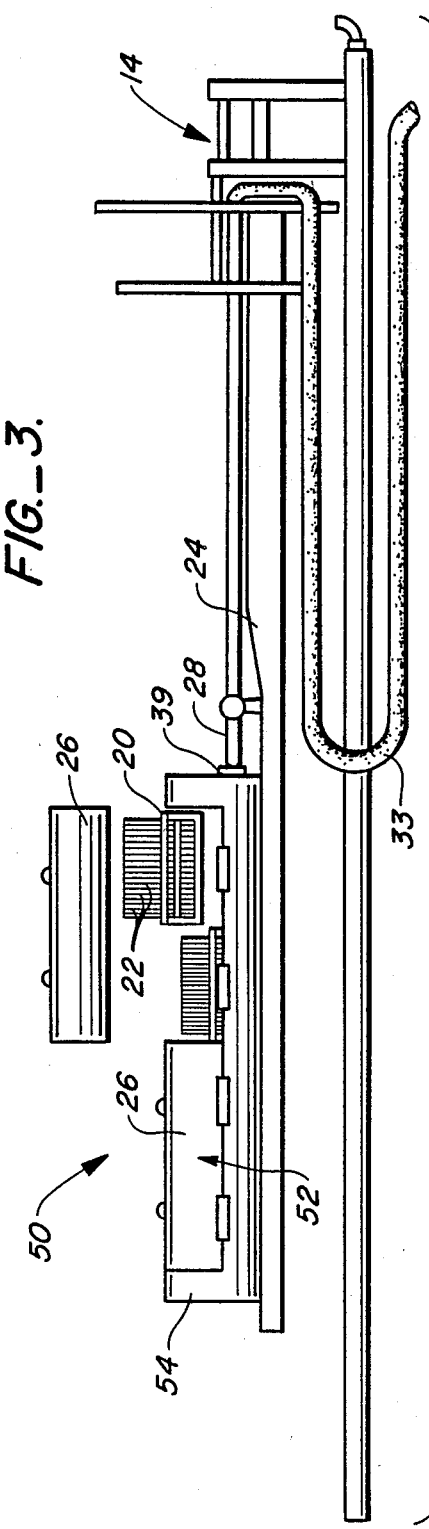

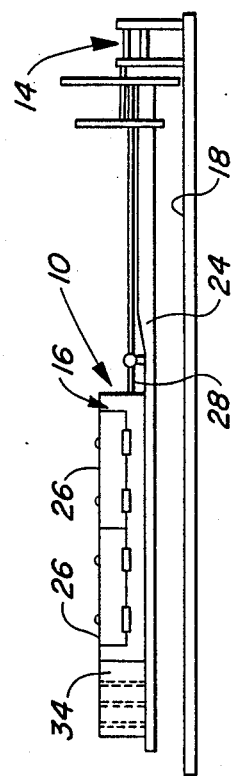
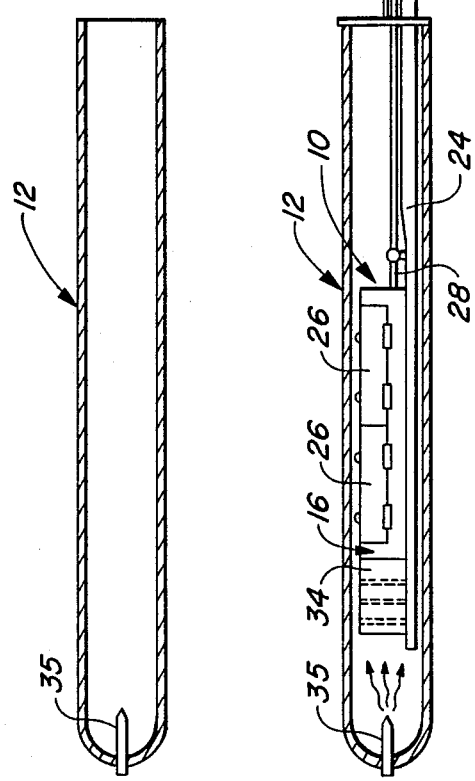
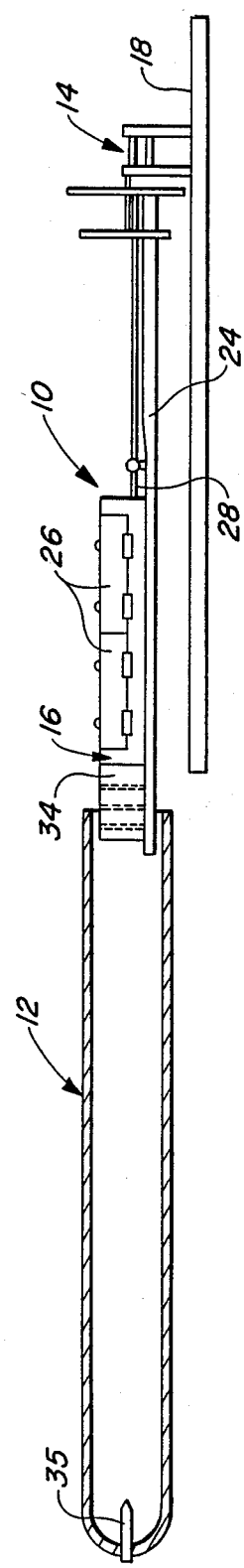
FIG._4A.  FIG._4B.  FIG._4C.

CONTROLLED DIFFUSION ENVIRONMENT CAPSULE AND SYSTEM

BACKGROUND OF THE INVENTION

1. Field of the Invention

The present invention relates generally to an improved form of furnace for use in the manufacture of semiconductor devices. More particularly, it relates to a capsule for use inside such a furnace for providing more uniform loading, process and unloading conditions and to a furnace incorporating such a capsule.

2. Description of the Prior Art

The use of generally tubular shaped furnaces for diffusion, oxidation, chemical vapor deposition and annealing processes in the manufacture of integrated circuits is well established. Critical dimensions in integrated circuits have become smaller, such as submicron line widths, and the diameters of semiconductor wafers in which the integrated circuits are fabricated have become larger, such as 6 inch wafers. These two trends result in the ability to produce more complex integrated circuits and the ability to produce larger numbers of such more complex integrated circuits in each semiconductor wafer.

Such developments have produced increased demands on the furnaces used in the fabrication of integrated circuits. The need for cleaner, more consistent, better controlled process environments has resulted in improved cantilever mechanisms for the insertion and removal of the semiconductor wafers from the furnaces, as disclosed in, for example, U.S. Pat. No. 4,523,885 issued to Bayne et al. This cantilever mechanism significantly reduces levels of particulate contamination in the furnaces. Another example of a cantilever mechanism is disclosed in U.S. Pat. No. 3,774,650, issued July 10, 1973 to Henebry et al.

In these non-contact wafer loading mechanisms, semiconductor wafers are loaded into quartz carriers which are then placed on two rods or a paddle extended from the cantilever carriage assembly. A motor-driven mechanism then slowly inserts the loaded carriers into a quartz process chamber held within the horizontal diffusion furnace. Because the wafer load is suspended on the cantilevered rods or paddle, no contact with the process chamber wall occurs. This "non-contact" loading dramatically reduces particles that would otherwise be generated if the loading apparatus were to "scrape" the process chamber wall.

Further improvements in process conditions result from the use of a secondary tube into which the semiconductor wafers are loaded, which is then placed inside the furnace tube, so that the furnace tube is positioned coaxially around the secondary tube. Such a system is disclosed, for example, in U.S. Pat. No. 4,526,534, issued July 2, 1985 to Wollman. That system achieved a degree of acceptance in the semiconductor industry, but additional improvements are required in order to meet the current and future requirements for integrated circuit manufacture.

SUMMARY OF THE INVENTION

Accordingly, it is an object of this invention to provide a furnace system for semiconductor processing in which particulate matter is substantially reduced, increased uniformity of process conditions across a semiconductor wafer and across a load of such wafers are obtained and unstable, sudden variations in process conditions during cooling are avoided.

It is another object of the invention to provide such a furnace system for semiconductor processing in which refractory metals or other oxide sensitive materials can be annealed without being oxidized.

It is a further object of the invention to provide such a furnace system for semiconductor processing in which consistent wet oxide growth uniformity at $\pm 1\%$ can be provided for semiconductor wafers up to 150 mm in diameter.

It is yet another object of this invention to provide such a furnace system for semiconductor processing in which consistent thin, dry oxide growth at $\pm 1\%$ can be provided for semiconductor wafers up to 150 mm in diameter.

It is a still further object of the invention to provide such a furnace system for semiconductor processing in which consistent wet oxide growth uniformity and consistent thin oxide growth at $\pm 1.5\%$ can be provided for semiconductor wafers up to 200 mm in diameter.

It is another object of the invention to provide such a furnace system for semiconductor processing in which reflow of interlayer dielectrics can be accomplished with no contact oxidation.

It is a further object of the invention to provide such a furnace system for semiconductor processing in which fixed oxide charge or related values may be consistently held to a level of $3 \times 10^{10}$ ions/cm$^2$ or better.

The attainment of these and related objects may be achieved through use of the novel controlled diffusion environment capsule and furnace incorporating the capsule herein disclosed. A controlled diffusion environment capsule and furnace in accordance with one form of this invention has a quartz, silicon carbide or other suitable material, typically refractory, furnace tube with a first end and a second end and a quartz, silicon carbide or other suitable material, typically refractory, process capsule having a first end and a distal end. The process capsule extends from the first end of the furnace tube into and is concentrically or eccentrically enclosed by the furnace tube. A gas injector tube has a plurality of axially extending, high aspect ratio orifices and extends interiorly along the quartz process capsule. As used herein, the term "high aspect ratio orifices" means that the orifices must have an aspect ratio in a range between about 4 to 1 to about 10 to 1. When the orifices have a high aspect ratio, the pressure drop between orifices, the velocity of gas flow from each orifice, and the volume of gas delivered by each orifice are the same. The furnace tube has a source of a reaction gas at its second end, proximate to the distal end of the process capsule. The process capsule has an inlet for the reaction gas comprising a first baffle extending across the distal end and having a centrally disposed aperture. A second baffle is behind the first baffle within the process capsule. A third baffle is behind the second baffle within the process capsule. The second and third baffles extend across the distal end of the process capsule and each having a plurality of apertures. The plurality of apertures of the second baffle are out of registration with the plurality of apertures of the third baffle. A means for supporting a plurality of semiconductor wafers concentrically in the process capsule is provided in the process capsule.

The attainment of the foregoing and related objects, advantages and features of the invention should be more readily apparent to those skilled in the art, after review of the following more detailed description of the invention, taken together with the drawings, in which:

BRIEF DESCRIPTION OF THE DRAWINGS

FIG. 1 is a perspective view of a first embodiment of a controlled diffusion environment capsule and furnace in accordance with the invention.

FIG. 2 is a cross-section view, taken along the line 2—2 in FIG. 1.

FIG. 3 is a side view of the controlled diffusion environment capsule in FIG. 1.

FIGS. 4A, 4B and 4C are side views of the controlled environment capsule and furnace of FIGS. 1–3 in use.

FIG. 5 is a side view of another embodiment of a controlled diffusion environment capsule in accordance with the invention.

FIG. 6 is a cross-section view similar to that of FIG. 2, but of another embodiment of a controlled diffusion environment capsule in accordance with the invention.

DETAILED DESCRIPTION OF THE INVENTION

Turning now to the drawings, more particularly to FIGS. 1–3, there is shown a controlled diffusion environment capsule system 10 and furnace 12 (see also FIG. 4B). The furnace 12 is a conventional tubular high temperature furnace as employed in semiconductor manufacturing. An example of such a furnace is disclosed, for example, in the above-identified Bayne patent. The system 10 includes a cantilever boat loading apparatus 14 and a quartz diffusion capsule 16. The loading apparatus is movable along track 18 to move the diffusion capsule 16 into and out of the furnace 12. When the loading apparatus 14 is in the position shown in FIG. 1, it supports the quartz diffusion capsule 16 concentrically or eccentrically within the furnace 12. The loading apparatus 14 moves to the left on the track 18 as shown in order to move the diffusion capsule 16 out of the furnace 12 for loading and unloading four standard quartz wafer carriers 20 from the capsule 16. The wafer carriers 20 each hold a substantial number, e.g., 25, semiconductor wafers 22 in closely spaced relationship for processing in the furnace 12. The diffusion capsule 16 is supported on a conventional silicon carbide paddle 24. Alternatively, a pair of cantilever rods 25 (see FIG. 6), as taught in the above-referenced Bayne et al patent, could be used in place of the paddle 24.

The capsule 16 has a removable cover or covers 26 for insertion and removal of the wafer carriers 20. One or more quartz injector tubes 28 (FIG. 2) extend the length of the diffusion capsule 16 along its bottom. An injector tube or tubes could also or alternatively be provided along the sides or top of the capsule 16. The injector tube 28 has multiple rows of high aspect-ratio orifices 30 extending along its length to disperse nitrogen or other inert gas uniformly across the surfaces 32 of the wafers 22. A gas supply tube 33 which flexes as the loading apparatus 14 moves the diffusion capsule 16 into and out of the furnace 12 is connected between the gas injector tube 28 and a gas manifold 37. Vent 39 for gas from the capsule 16 is provided as a gap around the feed through of injector tube 28 into the capsule 16. With only these vents for gas from the capsule 16, a positive pressure is easily maintained with a low flow of reactant gas or inert gas into the capsule 16, thus avoiding seepage of contaminating gases into the capsule 16.

A quartz extender 34 is connected or adjacent to the distal end of the diffusion capsule 16, through which reactant gases are supplied to the capsule 16 for diffusion and/or oxidation, from an inlet source 35 (FIG. 4B) of the reactant gases on the furnace tube near the extender 34. Reactant gases may also be supplied through the injector. The extender 34 has two apertured baffle plates 36 and 38 which have holes 40 and 42 in patterns that are offset relative to one another. A third plate 44 has a larger hole 46 at its center. The hole 46 focuses reactant gases into the capsule and the holes 40 and 42 provide turbulence to the reactant gas stream prior to its entry into the capsule 16 to assure uniform mixing, especially important for pyrogenically generated oxidizing fluids. A thermocouple 48 extends along the paddle 24 beneath the capsule 16 to measure temperature in the furnace 12 in use of the system 10.

In operation, standard quartz carriers 20 loaded with the semiconductor wafers 22 are nested and enclosed within the unique, all-quartz diffusion capsule 16. The quartz injector 28 resting within the capsule 16 assists in bringing the semiconductor wafers 22 to controlled, uniform thermal equilibrium. The semiconductor wafers 22 are protected from exposure to air by the capsule 16 as a mechanical barrier. The nitrogen within the capsule 16 also acts as a gas barrier against back-diffusion of air. Uniformly cooling the semiconductor wafers 22 and protecting them from air results in improved oxide surface states, such as $Q_f$ or $Q_{ss}$ values, better alloy results, and stops the oxidation of oxide-sensitive materials after anneal.

FIG. 4A shows the system 10 in its position in front of furnace tube 12 for loading and unloading the wafer carriers 20. Loading and unloading are readily accomplished by removing the covers 26 to allow easy access to the interior of the capsule 16.

FIG. 4B shows the system 10 in its process position, fully inserted inside the furnace tube 12. The injector tube 28 allows the inside of the capsule 16 to be purged of air by the injection of nitrogen or other inert gas before bringing the semiconductor wafers 22 to reaction temperature, such as 1200° C. Reactant gas source 35 provides an oxidizing gas to the capsule 16 after the semiconductor wafers 22 are at their reaction temperature. At the conclusion of pyrogenic oxidation, nitrogen is again injected into the capsule 16 through the injector tube 28 to purge the capsule of oxidizing gas. The system 10 is then moved to the position shown in FIG. 4C, with the extender 34 still inside the furnace 12 for a cool-down cycle. The nitrogen gas flow through the injector tube 28 is continued during the cool-down cycle to keep air out of the capsule 16 until the semiconductor wafers 22 have cooled sufficiently so that air contact can be tolerated. The system 10 is then returned to the position shown in FIG. 4A to unload the semiconductor wafers 22.

FIG. 5 shows another form of a controlled diffusion environment capsule system 50 for use with the furnace 12 for dry oxidation and annealing cycles. In the system 50, capsule 52 is sealed at its distal end 54. Otherwise, the construction of the system 50 is the same as that of the system 10 in FIGS. 1–4C. For dry oxidation, oxygen is introduced through the injector 28 directly into the capsule 52 after the semiconductor wafers have been brought to process temperature under a dry, inert atmosphere in the process position inside furnace 12. For annealing, nitrogen flow is maintained through the injector 28 during the annealing cycle. Other than an opening around the feed through of injector tube 28 into the capsule 52, the capsule 52 is sealed. A slight positive pressure is thus maintained in the capsule 52 to prevent introduction of contaminating gases with a relatively low flow rate of nitrogen or other inert gas.

In practice, certain dimensional relationships in the systems 10 and 50 have been found to be advantageous. The injector tube 28 should have a tube wall thickness of about 2–3 mm or thicker. The orifices 30 desirably have a diameter of from about 6 to about 10 mils (thousandths of an inch). As pointed out above, the orifices 30 should have an aspect ratio (ratio of diameter to length through the tube wall) of at least about 4, preferably about 10. A hole spacing of about ¼ to about 1 inch is desirably provided. The holes 30 can be aligned in rows, or radially displaced relative to one another along the tube 28. When provided in three rows as shown in FIGS. 2 and 6, the rows are preferably positioned at top dead center of the tube 28 and at ±60° with respect to top dead center. Gases provided by the injector are typically supplied to the injector at a pressure of from about 15 to about 35 psi. These relationships should be maintained for other than round apertures 30, which could also be employed, if desired.

As further shown in FIGS. 2 and 6, the wafers 22 must be concentrically positioned in the capsules 16 and 52. The diameter of the capsules 16 and 52 relative to the diameter of the wafers 22 should provide a conductive annulus 60 for gas flow of from about 5 to about 18 mm, typically about 10 to about 15 mm around the wafers 22, for wafer diameters generally employed in the semiconductor industry. The exhaust vent 39 should have a diameter of from about 2 to about 6 mm larger than the diameter of the injector tube 28 passing through it. Operating at these parameters gives uniform gas flow distributed in the capsules 16 and 52. The injector 28, conductive annulus 60 and exhaust vent 39 thus cooperate as a flow control to provide such uniform gas flow and barrier against backstreaming.

It should now be readily apparent to those skilled in the art that a novel controlled diffusion environment capsule system capable of achieving the stated objects of the invention has been provided. The system further substantially reduces particulate matter by protecting the wafers inside the capsule from ambient particulate contamination. Increased uniformity of process conditions across a semiconductor wafer are obtained. Unstable, sudden variations in process conditions during cooling are avoided. Refractory metals or other oxide sensitive materials can be annealed in the system without being oxidized. Consistent wet oxide growth uniformity at ±1% can be provided for semiconductor wafers up to 150 mm in diameter in the system. Consistent thin, dry oxide growth at ±1% can be provided for semiconductor wafers up to 150 mm in diameter in the system. Consistent thin, dry oxide growth at ±1.5% can be provided for semiconductor wafers up to 200 mm in diameter in the system. Reflow of interlayer dielectrics can be accomplished in the system with no contact oxidation. Fixed oxide charge or related values may be consistently held to a level of $3 \times 10^{10}$ ions/cm$^2$ or better.

It should further be apparent to those skilled in the art that various changes in form and details of the invention as shown and described may be made. It is intended that such changes be included within the spirit and scope of the claims appended hereto.

What is claimed is:

1. A controlled diffusion environment capsule system which comprises a furnace tube with a first end and a second end, a process capsule having a first end and a distal end and extending from the first end of said furnace tube into and being concentrically or eccentrically enclosed by said furnace tube, a gas injector tube having a plurality of axially extending high aspect ratio orifices, said gas injector tube extending interiorly along said process capsule, said furnace tube having a source of a reaction gas at the second end of said furnace tube proximate to the distal end of said process capsule, said process capsule having an inlet for the reaction gas comprising a first baffle extending across the distal end and having a centrally disposed aperture, a second baffle behind said first baffle within said process capsule, and a third baffle behind said second baffle within said process capsule, said second and third baffles extending across the distal end of said process capsule and each having a plurality of apertures, the plurality of apertures of said second baffle being out of registration with the plurality of apertures of said third baffle, and means for concentrically supporting a plurality of semiconductor wafers in said quartz process capsule.

2. The controlled diffusion environment capsule system of claim 1 in which said process capsule has at least one openable cover for insertion and removal of the semiconductor wafers.

3. The controlled diffusion environment capsule system of claim 1 in which said process capsule is supported within said furnace tube by at least one support member extending into said furnace tube beneath said process capsule from the first end of said furnace tube.

4. The controlled diffusion environment capsule system of claim 3 in which said at least one support member comprises two support legs.

5. The controlled diffusion environment capsule system of claim 4 in which said support legs are formed from quartz and are internally supported by a reinforcing insert.

6. The controlled diffusion environment capsule system of claim 3 in which said at least one support member comprises a support paddle.

7. The controlled diffusion environment capsule system of claim 3 in which said process capsule is supported by said at least one support member from a loading apparatus which is movable on a track to insert and remove said process capsule to and from said furnace tube.

8. The controlled diffusion environment capsule system of claim 1 in which said process capsule and said furnace tube are formed from quartz.

* * * * *